United States Patent
Toyoshima

(10) Patent No.: US 8,040,198 B2
(45) Date of Patent: Oct. 18, 2011

(54) PRINTED WIRING BOARD HAVING WIRE GROUNDING CONDUCTORS WITH DISTANCES THAT ARE 1/n THE WIDTH OF THE SIGNAL LINES

(75) Inventor: Ryoichi Toyoshima, Ushiku (JP)

(73) Assignee: Nippon Mektron, Ltd., Tokyo-To (JP)

(*) Notice: Subject to any disclaimer, the term of this patent is extended or adjusted under 35 U.S.C. 154(b) by 345 days.

(21) Appl. No.: 12/223,467

(22) PCT Filed: Jan. 31, 2008

(86) PCT No.: PCT/JP2008/051491
§ 371 (c)(1),
(2), (4) Date: Jul. 31, 2008

(87) PCT Pub. No.: WO2008/149572
PCT Pub. Date: Dec. 11, 2008

(65) Prior Publication Data
US 2010/0231331 A1    Sep. 16, 2010

(30) Foreign Application Priority Data
Jun. 6, 2007    (JP) .................................. 2007-150036

(51) Int. Cl.
*H01P 3/08* (2006.01)
(52) U.S. Cl. .......................................... 333/1; 333/238
(58) Field of Classification Search .................. 333/1, 4, 333/33, 238, 246
See application file for complete search history.

(56) References Cited

U.S. PATENT DOCUMENTS

| | | | |
|---|---|---|---|
| 4,680,557 A * | 7/1987 | Compton | .......................... 333/1 |
| 5,479,138 A | 12/1995 | Kuroda | |
| 5,682,124 A | 10/1997 | Suski | |
| 5,764,489 A | 6/1998 | Leigh | |
| 5,818,315 A * | 10/1998 | Moongilan | ................... 333/238 |
| 6,885,549 B2 * | 4/2005 | Thomason | ............... 361/679.27 |
| 2003/0116343 A1 | 6/2003 | Adachi | |

FOREIGN PATENT DOCUMENTS

| | | |
|---|---|---|
| JP | 62-009697 | 1/1989 |
| JP | 2000-077802 | 3/2000 |

(Continued)

OTHER PUBLICATIONS

International Search Report dated Feb. 26, 2008.

(Continued)

*Primary Examiner* — Benny Lee
(74) *Attorney, Agent, or Firm* — Jacobson Holman PLLC

(57) ABSTRACT

A microstrip line for a printed wiring board such as a flexible printed wiring board which includes a sandwiched thin insulating layer and cannot use a solid grounding conductor, the microstrip line being such that shape of grounding conductors relative to signal lines remains unchanged even in the presence of a curved shape and that overlapping areas of signal lines and grounding conductors located opposite to each other remain unchanged even in case of exposure misalignment or stack misalignment. A printed wiring board with a microstrip line structure in which signal lines are curved include wire-type grounding conductors located across an insulating layer from the signal lines, characterized in that wiring pitch of the grounding conductors is 1/n of width of the signal lines (where n is a natural number of 1 or 2).

1 Claim, 9 Drawing Sheets

FOREIGN PATENT DOCUMENTS

| | | |
|---|---|---|
| JP | 2000-114722 | 4/2000 |
| JP | 2001-085805 | 3/2001 |
| JP | 2001085805 | 3/2001 |
| JP | 2004-140308 | 5/2004 |
| JP | 2004140308 | 5/2004 |
| JP | 2006-147837 | 6/2006 |
| JP | 2006-173310 | 6/2006 |
| JP | 2006147837 | 6/2006 |
| JP | 2006173310 | 6/2006 |

OTHER PUBLICATIONS

European Search Report dated Nov. 5, 2009.

* cited by examiner (a)                                (b)

US 8,040,198 B2

PRINTED WIRING BOARD HAVING WIRE GROUNDING CONDUCTORS WITH DISTANCES THAT ARE ⅕ THE WIDTH OF THE SIGNAL LINES

This is a national stage of PCT/JP08/051,491 filed Jan. 31, 2008 and published in Japanese.

TECHNICAL FIELD

The present invention relates to a printed wiring board, and more particularly, to a structure of a printed wiring board used to transmit high-speed signals to meet the needs for size reduction and performance improvement of electric and electronic equipment.

BACKGROUND ART

Recently, signal processing speed of electronic equipment has been getting faster and faster. Consequently, transmission speed of signals passing through printed wiring boards has been increasing as well. In high-speed signal transmission, it is necessary to match characteristic impedance of signal lines, and mismatch will cause signal reflection, resulting in losses.

Generally, the characteristic impedance is 50Ω in the case of a single-ended channel, and 50Ω per signal line in the case of a differential channel. To obtain desired impedance, printed wiring boards which handle high-speed signals use a microstrip line in which a signal line 1 and grounding conductor 2 oppose each other across a substrate 3 as shown in FIG. 8.

Normally, microstrip lines use a solid grounding conductor. That is, an entire surface without a signal line is structured to be a ground plane. However, in the case of flexible printed wiring boards, substrates are 25 µm thick in many cases, and generally as thin as 12.5 to 50 µm. This increases capacitance between the signal line and grounding conductor, resulting in reduced characteristic impedance of the microstrip line.

For example, a microstrip line with a solid grounding conductor and with a signal line width of 122 µm has characteristic impedance of 50Ω when 100-µm-thick glass/epoxy prepreg (with a relative dielectric constant of 4) is used, but the characteristic impedance drops to 8Ω or less when 25-µm-thick polyimide (with a relative dielectric constant of 3.3) is used.

To reduce the capacitance between the signal line and solid grounding conductor and ensure characteristic impedance of 50Ω using the same polyimide material, it is necessary to reduce the signal line width to as small as 17 µm. Such a signal line can be produced if a thin conductor is used, but the narrow line width and small thickness will increase DC resistance.

Also, due to the narrow signal line width, variations in the width of formed signal lines have a significant impact, making it difficult to obtain desired impedance accurately. Thus, a square-meshed (see Patent Document 1) or diamond-meshed (see Patent Document 2) grounding conductor is often used.

However, since characteristic impedance varies depending on whether a signal line is located on opening or conductive portions of a meshed grounding conductor, the use of the meshed grounding conductor will cause impedance mismatch, resulting in signal reflection or losses.

Also, when a signal line is laid out in a bent form, position of the signal line relative to the mesh changes before and after the signal line is bent. This causes characteristic impedance mismatch.

To deal with this, a technique has been proposed for making a meshed shape conform to the curved shape of the signal line (see Patent Document 3). Also, a technique has been proposed for controlling opening size of the mesh in inner and outer regions of the curved shape or controlling signal line width (see Patent Document 4).

However, width of the wire-type grounding conductors 5 is always equal to (as shown in FIG. 9(a)), or larger than, width of signal lines 4. If it is assumed that there is no misalignment between the wire-type grounding conductors and signal lines, since the wire-type grounding conductors are equal in area to the opposing signal lines, the capacitance between the signal lines and grounding conductors is the same as in the case of a solid grounding conductor.

Thus, when a thin insulating layer is put between the signal lines and grounding conductors as in the case of a flexible printed wiring board, it is difficult to transmit large current or control impedance accurately.

Also, misalignment can occur in an actual manufacturing process as shown in FIG. 9(b), causing changes in the overlapping areas of signal lines 6 and grounding conductors 7 located opposite to each other. This makes it impossible to obtain desired impedance.

Patent Document 1: Japanese Patent Laid-Open No. 2000-114722
Patent Document 2: Japanese Patent Laid-Open No. 2006-147837
Patent Document 3: Japanese Patent Laid-Open No. 2006-173310
Patent Document 4: Japanese Patent Laid-Open No. 2000-077802
Patent Document 5: Japanese Patent Laid-Open No. 2001-085805

SUMMARY OF THE INVENTION

When a mesh is made to conform to a curved shape as described in Patent Document 3, although the meshed shape remains unchanged before and after curved segments of the signal line, the meshed shape changes continuously in the curved segments of the signal line. If changes in the meshed shape is negligible, their impact can be ignored, but if the changes are longer than one quarter wavelength of a transmission frequency, their impact shows up as impedance mismatch.

Generally, a curved signal line has a predetermined radius of curvature to prevent reflection, and the larger the radius of curvature, the more advantageous it is for preventing reflection. For example, if the radius of curvature is 5 mm and an angle of a curved shape is 90°, length of the curved shape is approximately 7.9 mm.

This length corresponds to approximately one quarter wavelength of polyimide (∈r=3.3) at 5 GHz. In this case, impedance mismatch has an impact when a 5-GHz or higher-frequency signal is transmitted. When the radius of curvature increases further, the curved shape becomes longer, and consequently, the frequency at which the impact of the impedance mismatch occurs shifts to lower frequencies.

Also, as described in Patent Document 4, to control the mesh opening relative to the curved shape or control the signal line width, it is necessary to go through a cycle of simulating the mesh opening or signal line width on a product by product basis, verifying the actual product, and carrying out a redesign as required.

Thus, it takes time to obtain desired characteristics, which makes the technique unsuitable for mass production. Also, any misalignment of the signal line with the mesh during exposure or stacking of layers for constituting a flexible printed board, will change overlapping areas of the signal line and meshed grounding conductor located opposite to each other, making it impossible to obtain desired impedance.

To deal with this, a technique has been proposed for placing signal lines opposite and parallel to wire-type grounding conductors and thereby keeping the shape of the grounding conductors relative to the signal lines constant regardless of curved shape of the signal lines (see Patent Document 5).

The present invention has been made in view of the above points and has an object to provide a microstrip line for a printed wiring board such as a flexible printed wiring board which includes a sandwiched thin insulating layer and cannot use a solid grounding conductor, the microstrip line being such that the shape of grounding conductors relative to signal lines remains unchanged even in the presence of a curved shape and that overlapping areas of signal lines and grounding conductors located opposite to each other remain unchanged even in case of exposure misalignment or stack misalignment.

To achieve the above object, the present invention provides a printed wiring board with a microstrip line structure in which signal lines are curved, including wire-type grounding conductors located across an insulating layer from the signal lines, characterized in that wiring pitch of the grounding conductors is 1/n of width of the signal lines (where n is a natural number of 1 or 2).

Also, as the wiring pitch of the wire-type grounding conductors is 1/n the signal line width (where n is a natural number of 1 or 2), overlapping areas of signal lines and grounding conductors located opposite to each other can be kept constant even in case of misalignment.

In so doing, by using a low dielectric constant material such as polyimide, liquid crystal polymer, or fluororesin as an interlayer insulating resin of a substrate, it is possible to reduce capacitance between the signal lines and grounding conductors.

This allows signal line width to be increased, making it possible to increase thickness of the wire-type grounding conductors laid out in parallel to the signal lines, and thus reduce difficulty of an etching process.

Also, the above-described materials, which normally have a lower dielectric-loss factor than a glass-epoxy board, can reduce dielectric losses at radio frequencies. Thus, these materials are advantageous for high-speed signal transmission.

According to the present invention, when a microstrip line is formed on a printed wiring board such as a flexible printed wiring board which has a thin insulating layer, the shape of the grounding conductors relative to the signal lines is always kept constant even if the signal lines are curved and the overlapping areas of signal lines and grounding conductors located opposite to each other can be kept constant even in case of misalignment.

This makes it possible to provide a printed wiring board which has a microstrip line structure suitable for high-speed signal transmission and thereby contribute to size reduction and performance improvement of electronic equipment.

DESCRIPTION OF SYMBOLS

1; 4; 6; 8; 11; 14; 18; 25: signal lines, 2: solid grounding conductor, 3: substrate, 5; 9; 12; 15; 19; 26: wire-type grounding conductor, 7: misaligned wire-type grounding conductor, 10: polyimide, 13: liquid crystal polymer, 16: double-sided copper-clad laminate, 17; 24: hole, 20; 27: protective layer, 21; 28: plating, 22; 29: wiring pattern excluding signal lines and grounding conductors, 23: double-sided copper-clad laminate.

BEST MODE FOR CARRYING OUT THE INVENTION

According to a concrete embodiment of the present invention, a microstrip line with characteristic impedance of 50Ω can be formed using a substrate 12.5 to 50 μm thick and a conductor 5 to 18 μm thick and by setting signal line width within a range of 25 to 500 μm, and wiring pitch of wire-type grounding conductors within a range of 25 to 500 μm.

Geometries of such microstrip lines need to be controlled with high accuracy. If a microstrip line is formed after plating for interlayer connection, variations in thickness of the plating cause variations in the geometry, making it difficult to control impedance accurately.

To deal with this, signal lines and wire-type grounding conductors are formed before the plating for interlayer conduction, and then masked by a protective film, followed by the plating for interlayer conduction and removal of the protective film. This makes it possible to shape the signal lines and wire-type grounding conductors accurately, and thereby improve accuracy of impedance control.

Embodiments of the present invention will be described below with reference to the drawings, FIGS. 1-8, where like features in different drawing figures are denoted by the same reference number and may not be described in detail in each drawing figure in which they appear.

First Embodiment

Figure 1:
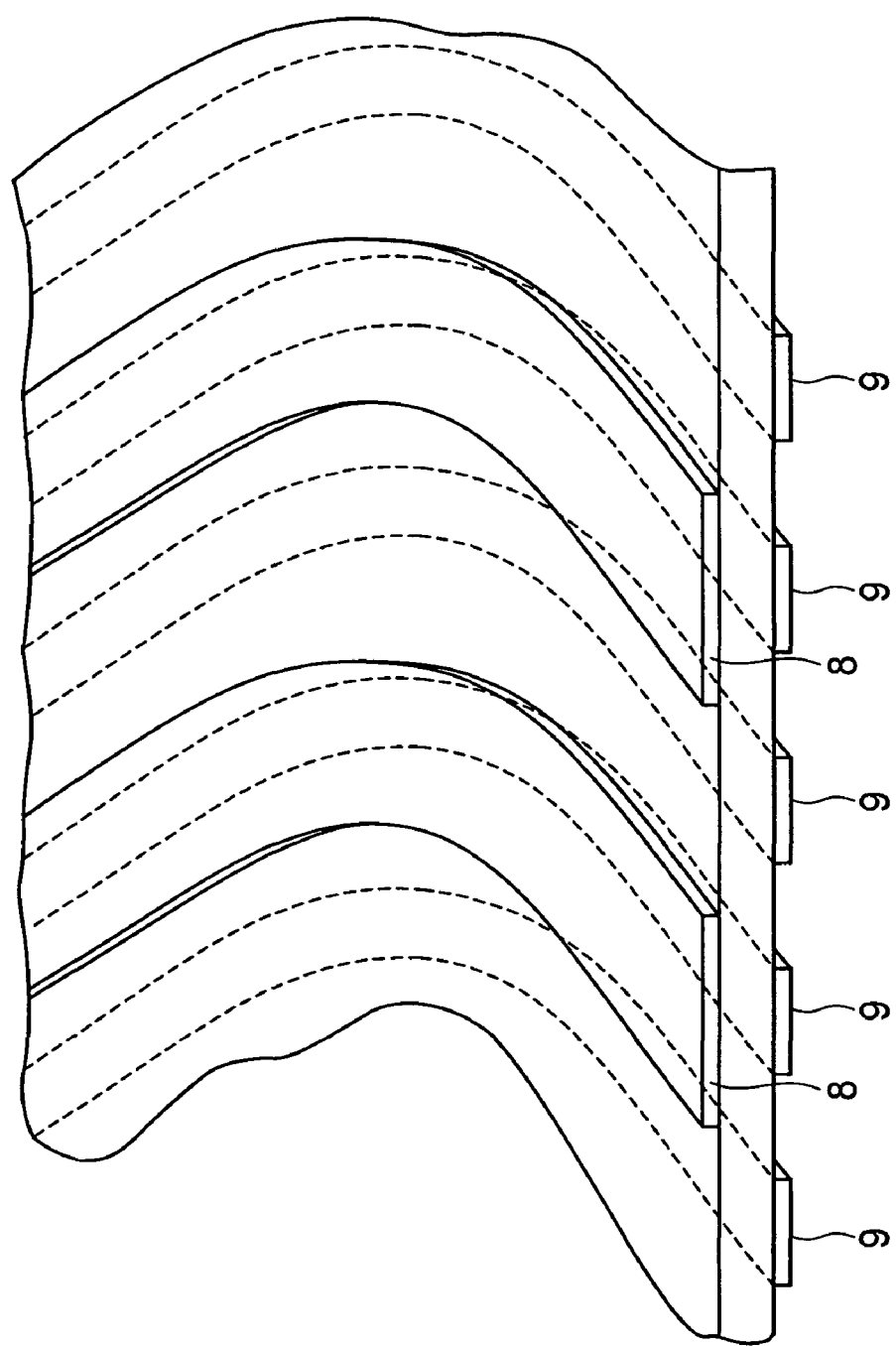
FIG. 1 is a perspective view showing a typical structure of a microstrip line according to the present invention.

With the configuration of the present invention, as the wire-type grounding conductors 9 are laid along the signal lines 8 on the side opposite from the signal lines 8 as shown in FIG. 1, the shape of the grounding conductors relative to the signal lines remains unchanged even though the signal lines are curved.

Figure 2:
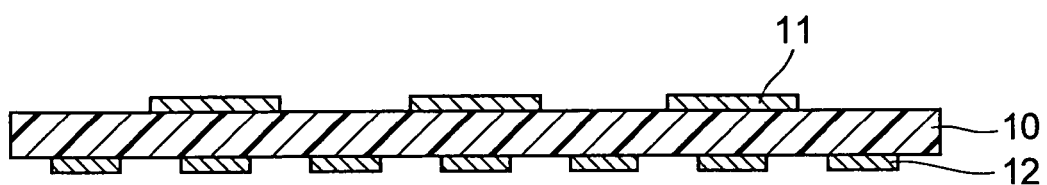
FIG. 2 is a sectional structural diagram according to a first embodiment of the present invention.

FIG. 2 is a sectional diagram of a microstrip line according to an embodiment of the present invention.

A double-sided copper-clad laminate (Metaloyal [Registered Trade Mark] PI-25D-CCW-08D0 (#25), manufactured by Toyo Metallizing Co., LTD.) is used as a starting material.

This material has been selected for the following two reasons.

(1) In a microstrip line, a high dielectric constant of a substrate will increase capacitance between signal lines and grounding conductors, making it necessary to decrease signal line width to obtain desired characteristic impedance.

However, a narrow signal line width will increase the difficulty of forming wiring lines, making it impossible to accurately control impedance. Thus, polyimide which has a low dielectric constant is desirable for the substrate.

(2) Copper foils used for copper-clad sheets normally go through a roughing process known as backside processing to ensure adherence to the substrate. However, increased inductance caused by the backside processing is disadvantageous for the control of characteristic impedance. Thus, a copper-clad sheet without backside processing is desirable.

A microstrip line is formed using polyimide 10 and a copper foil, where a substrate of the polyimide 10 is 25 μm thick and the copper foil is 8 μm thick. Grounding conductors 12 of the microstrip line are of a wire type and formed along signal lines 11. Wiring pitch of the grounding conductors 12 is 1/n the signal line width (where wiring pitch is a distance between centerlines of grounding conductors, and n is a natural number of 1 or 2).

To achieve characteristic impedance of 50Ω, for example, signal line width is 92 μm, n is 1, the wiring pitch of the grounding conductors is 92 μm, width of the grounding conductor is 46 μm, and the number of grounding conductors is 7 while the number of signal lines is 3.

Second Embodiment

Figure 3:
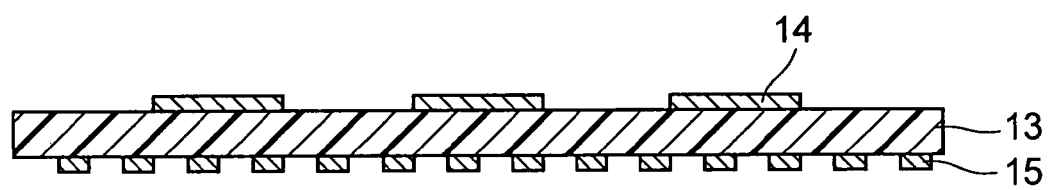
FIG. 3 is a sectional structural diagram according to a second embodiment of the present invention.

FIG. 3 is a sectional view according to a second embodiment of the present invention. According to the second embodiment, a liquid crystal polymer is used for a substrate 13 instead of the polyimide according to the first embodiment, the liquid crystal polymer having a lower dielectric factor. This further reduces the capacitance between signal lines and grounding conductors, making it easier to process the signal lines of the given width.

Also, liquid crystal polymers, which have a lower dielectric-loss factor than polyimide, can reduce dielectric losses at radio frequencies. Thus, liquid crystal polymers are advantageous for high-speed signal transmission. A double-sided copper-clad laminate (ESPANEX [Registered Trade Mark] LB-09-25-09NE, manufactured by Nippon Steel Chemicals Co., LTD.) is used as a starting material.

A substrate of a liquid crystal polymer is 25 μm thick and a copper foil which is originally 9 μm thick is half-etched to 5 μm. A microstrip line is formed using the half-etched material.

Grounding conductors 15 of the microstrip line are of a wire type and formed along signal lines 14. Wiring pitch of the grounding conductors 15 is 1/n the signal line width (where n is a natural number of 1 or 2).

To achieve characteristic impedance of 50Ω, for example, signal line width is 100 μm, n is 2, the wiring pitch of the grounding conductors is 50 μm, width of the grounding conductor is 25 μm, and the number of grounding conductors is 14 while the number of signal lines is 3.

Third Embodiment

Figure 4:
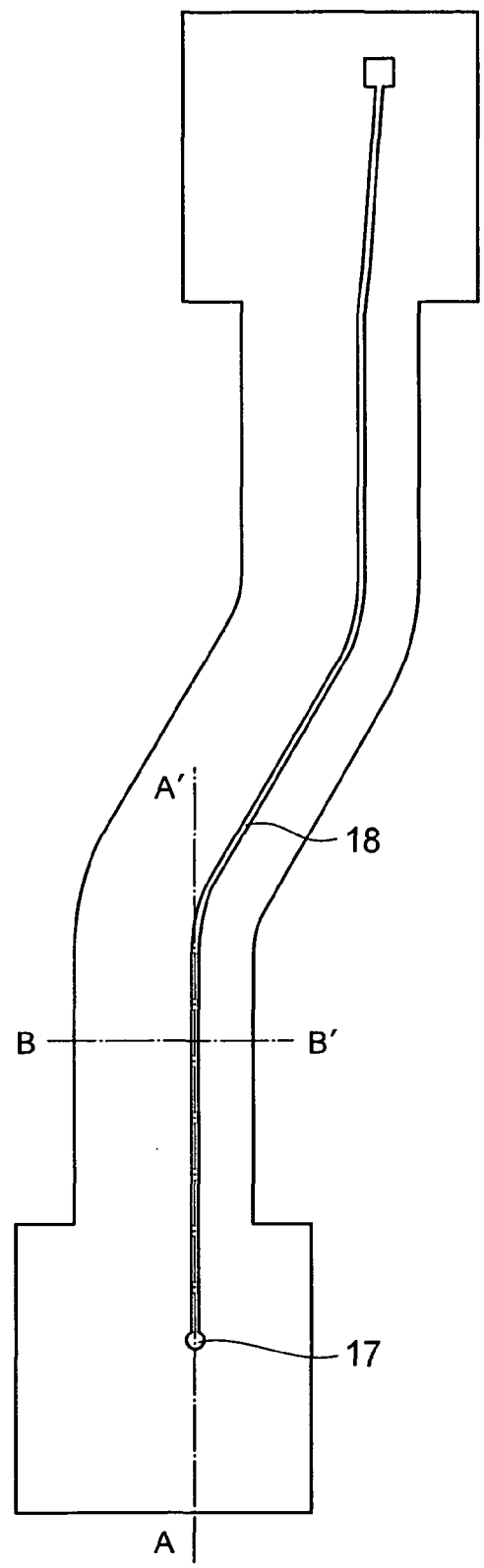
FIG. 4 is a plan view of a flexible printed wiring board according to a third embodiment of the present invention as viewed from a wiring layer in a mounting portion.
Figure 5A:
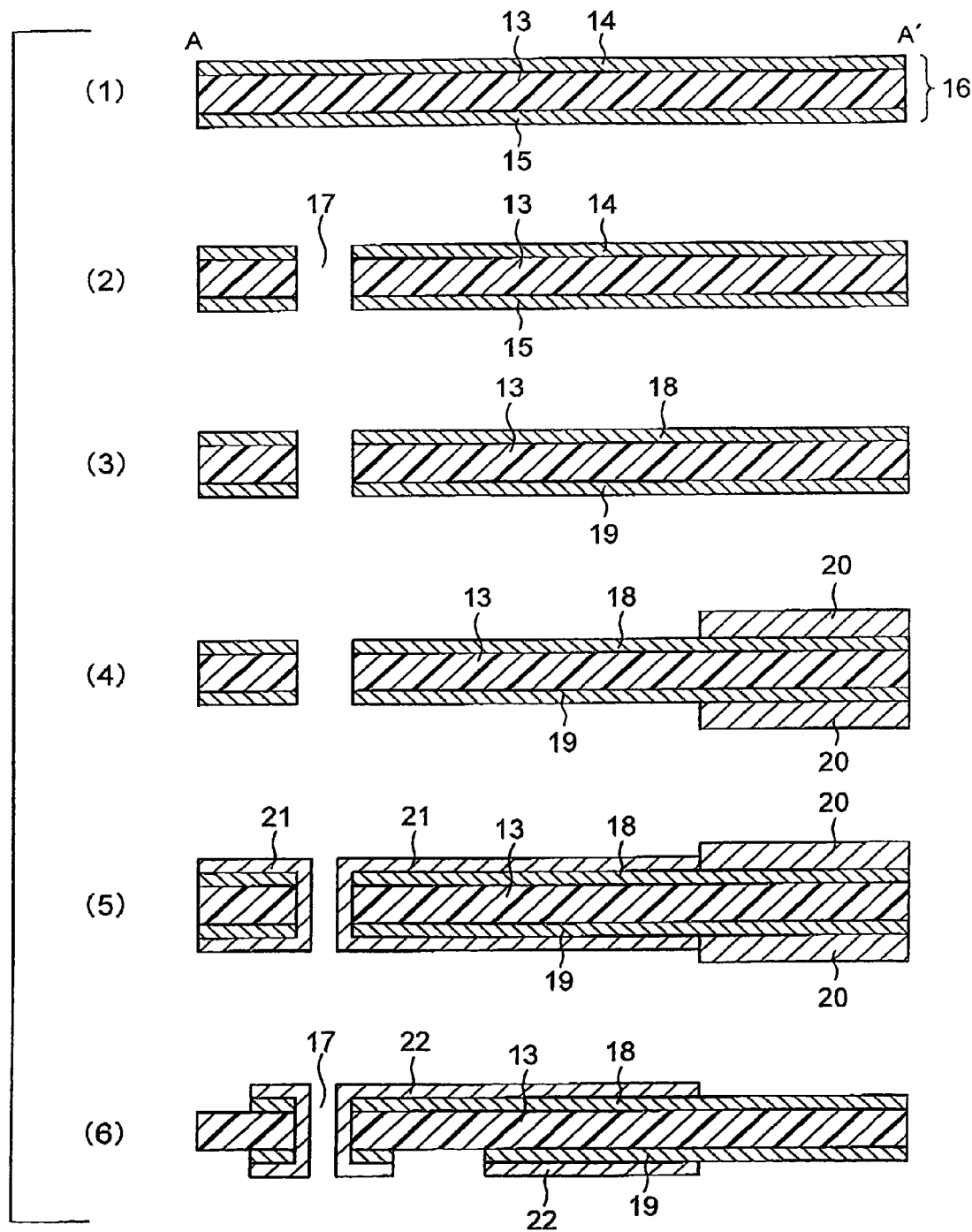
FIG. 5A is a sectional view taken along line A-A' in FIG. 4 to illustrate a formation method of the flexible printed wiring board according to the third embodiment.
Figure 5B:
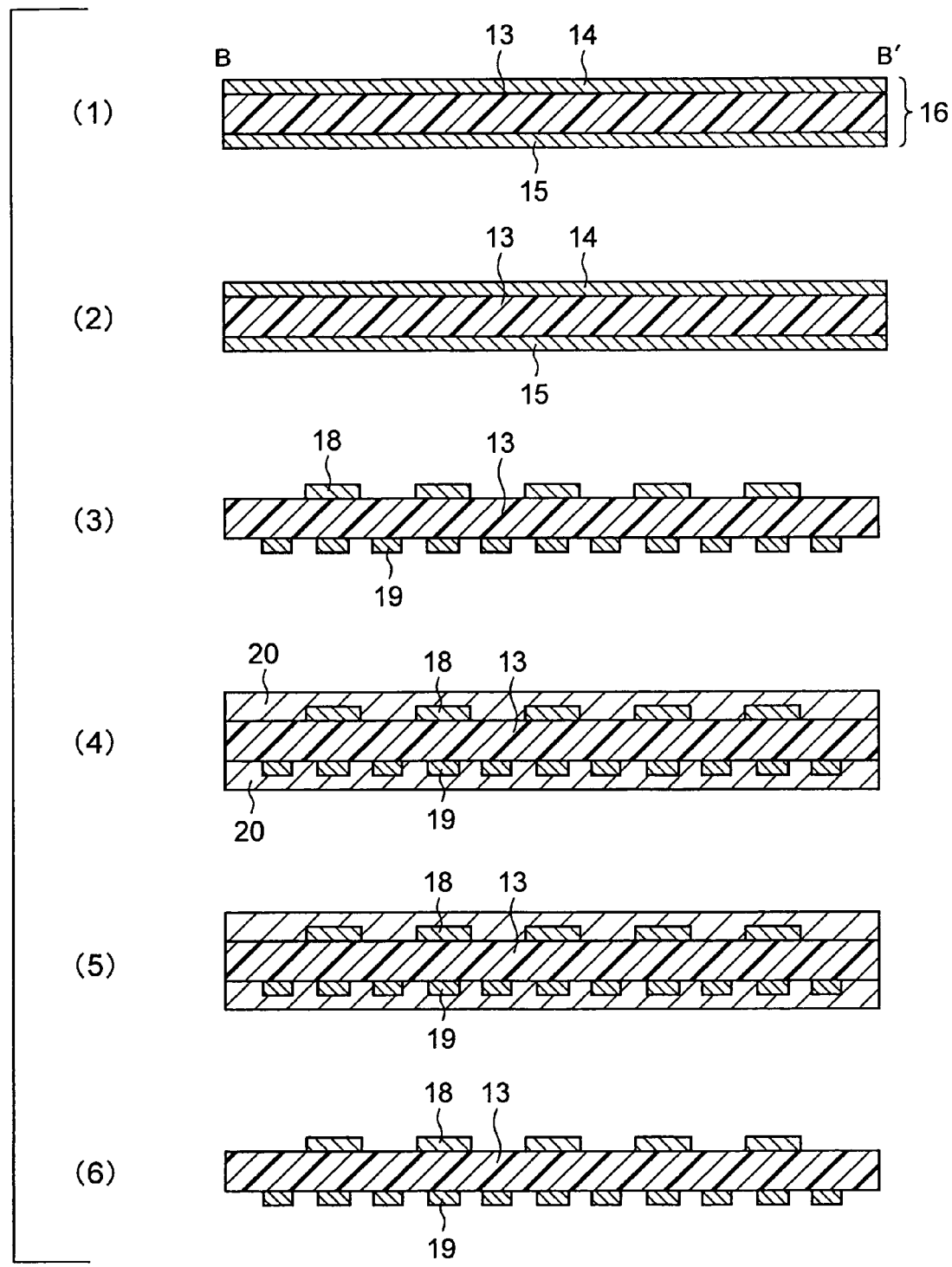
FIG. 5B is a sectional view taken along line B-B' in FIG. 4 to illustrate the formation method of the flexible printed wiring board according to the third embodiment.

FIG. 4 is a plan view according to a third embodiment of the present invention. FIGS. 5A and 5B are sectional views taken along line A-A' and line B-B' in FIG. 4, respectively.

First, as shown in FIG. 5A(1) and 5B(1), a double-sided copper-clad laminate 16 with a copper foil thickness of 4 μm is prepared. Available materials include double-sided copper-clad laminate Metaloyal PI-25D-CCW-04D0 (#25) (manufactured by Toyo Metallizing Co., LTD.) for the reasons shown in the first embodiment.

Next, as shown in FIG. 5A(2), a hole 17 for use as a via for interlayer connection is formed. It does not matter whether the via is a through-hole or blind hole. Regarding methods for forming the hole, examples include mechanical drilling, punching, laser drilling, plasma processing, and chemical etching in the case of a through-hole, or examples include laser drilling, plasma processing, and chemical etching in the case of a blind hole. In this embodiment, a through-hole with a diameter of 50 μm is formed by UV-YAG laser.

Furthermore, a microstrip line is formed as shown in FIG. 5B(3). Grounding conductors 19 of the microstrip line are of a wire type and formed along signal lines 18. Wiring pitch of the grounding conductors 19 is 1/n the signal line width (where n is a natural number of 1 or 2).

As an example, signal line width is 96 μm, n is 1, the wiring pitch of the grounding conductors is 48 μm, width of the grounding conductor is 24 μm, characteristic impedance is 50Ω and the number of grounding conductors is 11 while the number of signal lines is 5.

Subsequently, as shown in FIG. 5A(4) and FIG. 5B(4), a protective layer 20 is formed for the grounding conductors and signal lines formed in FIG. 5B(3). There are no particular restrictions on material of the protective layer 20 as long as the material withstands a subsequent plating process for interlayer connection and lends itself to subsequent removal. In this embodiment, 20-μm-thick dry film resist SPG202 (manufactured by Asahi Kasei EMD Corporation) is laminated and only areas corresponding to grounding conductors and signal lines are exposed and developed.

Next, as shown in FIG. 5A(5), plating 21 is applied for interlayer connection. Since the signal lines and grounding conductors are covered with the protective layer, the plating will not separate out. Plating thickness, which is smaller than thickness of the protective layer, is 10 μm in this embodiment.

Finally, as shown in FIG. 5A(6), the protective film is removed to form a wiring pattern 22 in areas where the microstrip line is not formed. Land diameter of the via 17 allows for exposure misalignment of signal lines 18 and grounding conductors 19 already formed with the wiring pattern 22 to be formed later.

The above processes make it possible to produce a flexible printed wiring board containing a microstrip line in which impedance is controlled with high accuracy.

Fourth Embodiment

Figure 6:
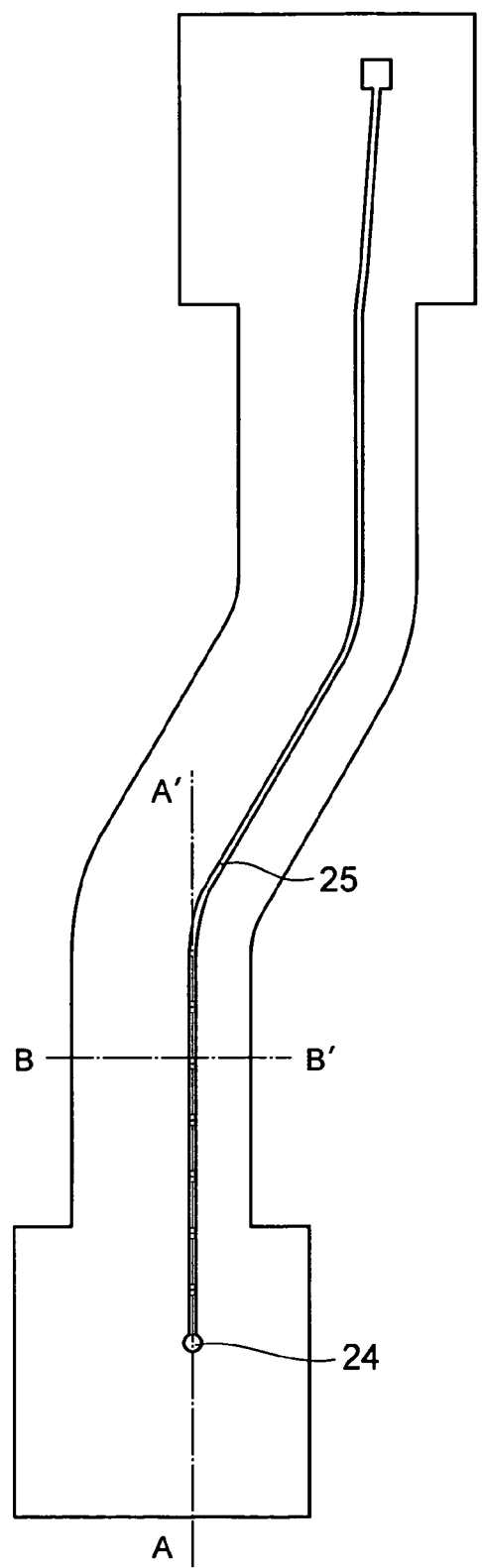
FIG. 6 is a plan view of a flexible printed wiring board according to a fourth embodiment of the present invention as viewed from a wiring layer in a mounting portion.
Figure 7A:
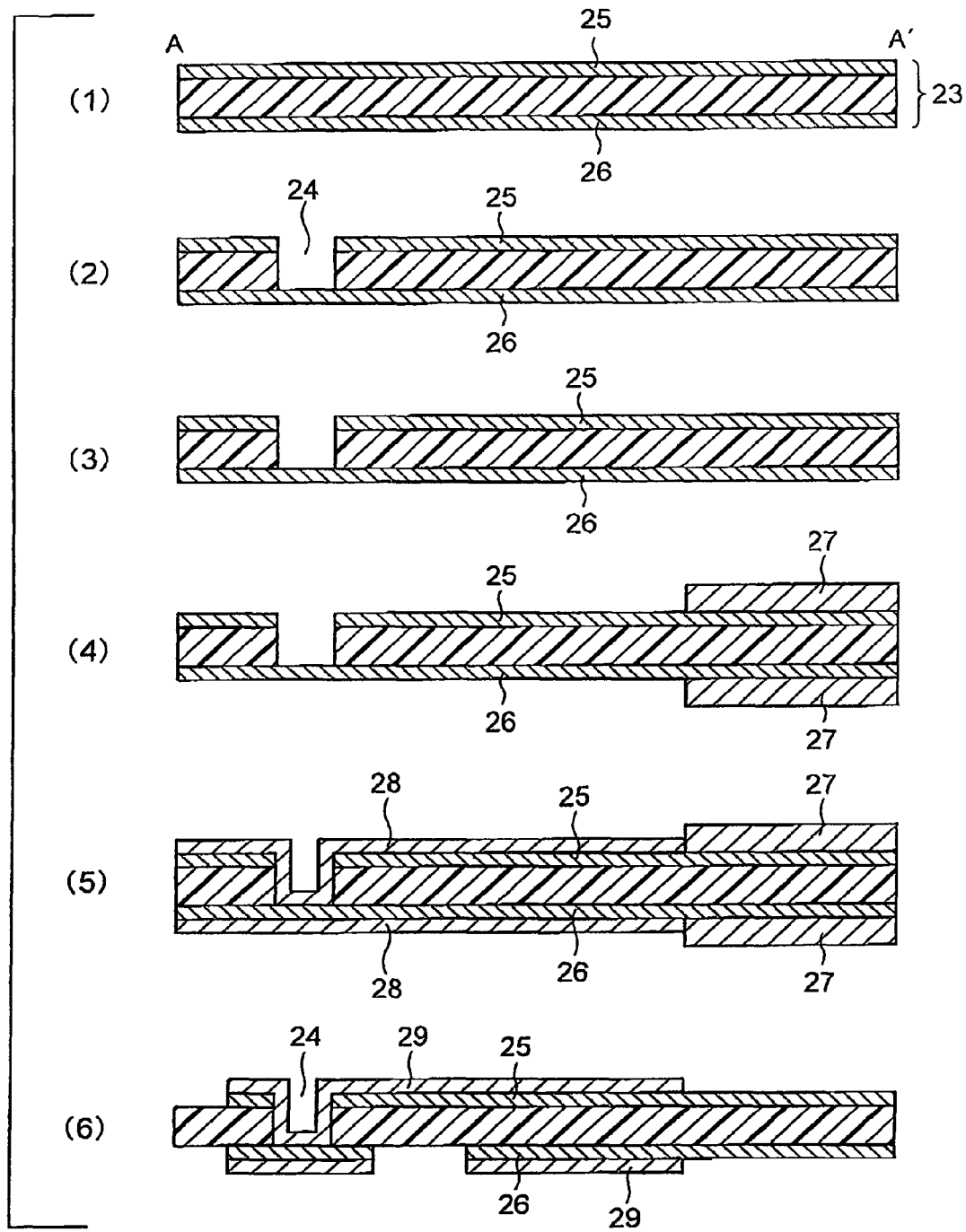
FIG. 7A is a sectional view taken along line A-A' in FIG. 6 to illustrate a formation method of the flexible printed wiring board according to the fourth embodiment.
Figure 7B:
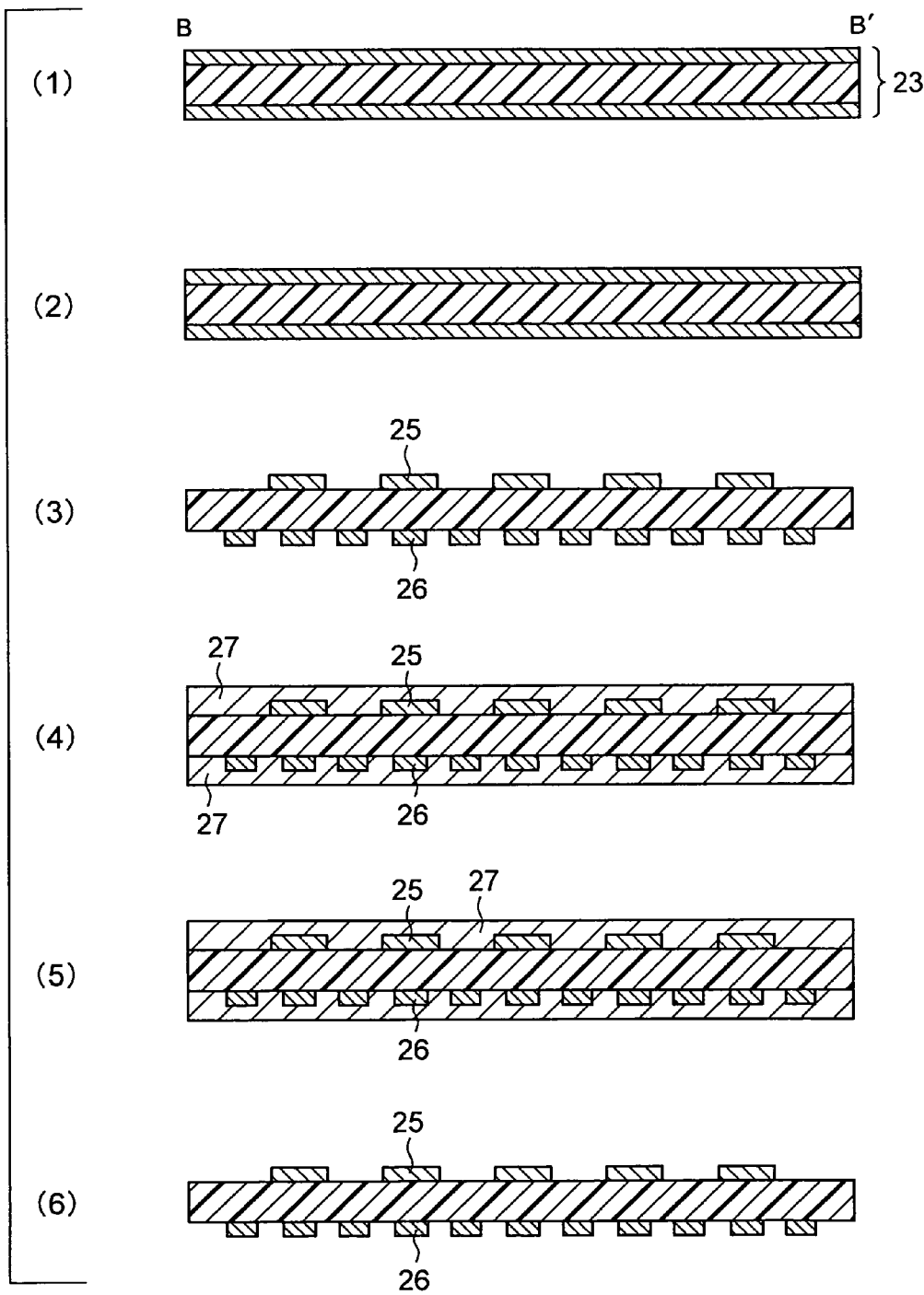
FIG. 7B is a sectional view taken along line B-B' in FIG. 6 to illustrate the formation method of the flexible printed wiring board according to the fourth embodiment.
Figure 8:
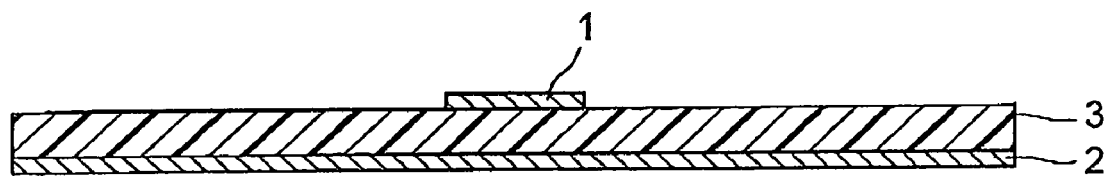
FIG. 8 is a sectional structural diagram of a conventional microstrip line.
Figure 9:
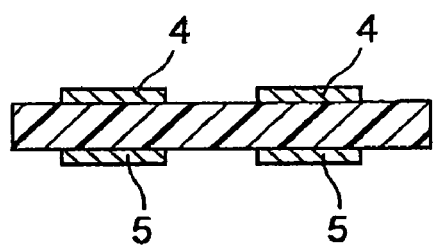
FIG. 9, consisting of FIGS. 9($a$) and 9($b$) are sectional views illustrating a conventional problem of grounding conductors parallel to signal lines.
Figure 9:
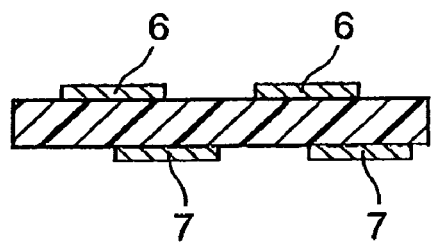

FIG. 6 is a plan view according to a fourth embodiment of the present invention. FIGS. 7A and 7B are sectional views taken along line A-A' and line B-B' in FIG. 6, respectively.

First, as shown in FIG. 7A(1) and FIG. 7B(1), a double-sided copper-clad laminate 23 with a copper foil thickness of 9 μm is prepared. A double-sided copper-clad laminate (ESPANEX [Registered Trade Mark] LB-09-25-09NE, manufactured by Nippon Steel Chemicals Co., LTD.), the thickness of the copper foil is 9 μm is used here for the reasons shown in the first and second embodiments.

Next, as shown in FIG. 7A(2), a hole 24 for use as a via for interlayer connection is formed. It does not matter whether the via is a through-hole or blind hole. Regarding methods for forming the hole, there are no particular restrictions, and examples include mechanical drilling, punching, laser drilling, plasma processing, and chemical etching in the case of a through-hole, or examples include laser drilling, plasma processing, and chemical etching in the case of a blind hole. In this embodiment, a blind hole with a diameter of 50 μm is formed by UV-YAG laser.

Furthermore, a microstrip line is formed as shown in FIG. 7B(3). Grounding conductors 26 of the microstrip line are of a wire type and formed along signal lines 25. Wiring pitch of the grounding conductors 26 is 1/n the signal line width (where n is a natural number of 1 or 2).

As an example, signal line width is 100 μm, n is 1, the wiring pitch of the grounding conductors is 100 μm, width of the grounding conductor is 50 μm, characteristic impedance is 50Ω and the number of grounding conductors is 11 while the number of signal lines is 5.

Subsequently, as shown in FIG. 7A(4) and FIG. 7(B)4, a protective layer 27 is formed for the grounding conductors and signal lines formed in FIG. 7A(3) and FIG. 7B(3). There are no particular restrictions on material of the protective layer 27 as long as the material withstands a subsequent plating process for interlayer connection and lends itself to subsequent removal.

In this embodiment, 20 μm-thick dry film resist SPG202 (manufactured by Asahi Kasei EMD Corporation) is laminated and only areas corresponding to grounding conductors and signal lines are exposed and developed.

Next, as shown in FIG. 7A(5), plating 28 is applied for interlayer connection. Since the signal lines and grounding conductors are covered with the protective layer, the plating will not separate out. Plating thickness, which is smaller than thickness of the protective layer, is 10 μm in this embodiment.

Finally, as shown in FIG. 7A(6), the protective film is removed to form a wiring pattern 29 in areas where the microstrip line is not formed. Land diameter of the via 24 allows for exposure misalignment of signal lines 25 and grounding conductors 26 already formed with the wiring pattern 29 to be formed later.

The above processes make it possible to produce a flexible printed wiring board containing a microstrip line in which impedance is controlled with high accuracy.

The invention claimed is:

1. A printed wiring board having a microstrip line structure in which signal lines laid on an insulating layer are curved, comprising
   wire-type grounding conductors located across the insulating layer from the signal lines,
   a distance between centerlines of the grounding conductors is 1/n of the width of the signal lines, where n is a natural number of 1 or 2.

* * * * *